(12) United States Patent
Lee

(10) Patent No.: US 7,169,514 B2
(45) Date of Patent: Jan. 30, 2007

(54) EXTREME ULTRAVIOLET MASK WITH MOLYBDENUM PHASE SHIFTER

(75) Inventor: Sang Hun Lee, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 185 days.

(21) Appl. No.: 10/750,122

(22) Filed: Dec. 31, 2003

(65) Prior Publication Data

US 2005/0147894 A1 Jul. 7, 2005

(51) Int. Cl.
*G01F 9/00* (2006.01)

(52) U.S. Cl. ......................................................... 430/5

(58) Field of Classification Search ............... 430/5; 378/35

See application file for complete search history.

(56) References Cited

U.S. PATENT DOCUMENTS

| | | | |
|---|---|---|---|
| 5,935,733 A | 8/1999 | Scott et al. | |
| 6,641,959 B2 * | 11/2003 | Yan | 430/5 |
| 6,875,543 B2 * | 4/2005 | Chapman et al. | 430/5 |
| 2002/0146648 A1 | 10/2002 | Ghandehari et al. | |
| 2003/0027053 A1 | 2/2003 | Yan | |
| 2003/0054260 A1 | 3/2003 | Dao et al. | |
| 2004/0091789 A1 * | 5/2004 | Han et al. | 430/5 |

FOREIGN PATENT DOCUMENTS

| | | |
|---|---|---|
| JP | 58033253 | 2/1983 |
| JP | 61270761 | 12/1986 |
| WO | PCT/US2004/043651 | 12/2004 |

\* cited by examiner

*Primary Examiner*—S. Rosasco
(74) *Attorney, Agent, or Firm*—George Chen

(57) ABSTRACT

The present invention describes a method including: providing a substrate, the substrate including a first region and a second region; forming a multilayer mirror over the substrate; forming a phase-shifter layer over the multilayer mirror; forming a capping layer over the phase-shifter layer; removing the capping layer and the phase-shifter layer in the second region; illuminating the first region and the second region with EUV light; and reflecting the EUV light off the first region and the second region.

The present invention also describes a structure including: a substrate, the substrate including a first region and a second region; a multilayer mirror located over the first region and the second region; a phase-shifter layer located over the multilayer mirror in the region; an intensity balancer layer located over the multilayer mirror in the second region; and a capping layer located over the phase-shifter layer in the first region and over the intensity balancer layer in the second region.

7 Claims, 2 Drawing Sheets

EXTREME ULTRAVIOLET MASK WITH MOLYBDENUM PHASE SHIFTER

BACKGROUND OF THE INVENTION

1. Field of the Invention

The present invention relates to the field of semiconductor integrated circuit (IC) manufacturing, and more specifically, to a phase-shifting mask for extreme ultraviolet (EUV) photolithography and a method of forming a phase-shifting mask for EUV photolithography.

2. Discussion of Related Art

In 1965, Gordon Moore first observed that the number of devices per area on an integrated circuit (IC) chip doubled approximately every 18 months. For over 3 decades, the semiconductor industry has managed to achieve the rate of increase in device density projected by Moore's Law by developing many new designs and new processes. Significant improvements in doping, deposition, and etch have enhanced the precision that concentration, depth, and thickness can be controlled across the IC chip.

In the past, scaling of the chip has been accomplished by shrinking the dimensions of the devices in the substrate as well as the dimensions of the interconnections between the devices. Thus, a continual enhancement in photolithography has contributed to repeated reductions in a critical dimension (CD) that can be successfully patterned in a feature on a device.

According to the Rayleigh criterion, the minimum CD which can be resolved by an imaging system is directly proportional to a wavelength of the radiation, or light, from the illumination source and inversely proportional to a numerical aperture (NA) of the projection optics. The NA is the product of a refractive index (n) and the sine of the convergence angle (theta).

The wavelength of light used for exposure of photoresist depends on the available illumination source and has been decreased over time from 436 nanometers (nm) to 365 nm (both being ultraviolet or UV light), and, subsequently, to 248 nm and then to 193 nm (both being deep ultraviolet or DUV light). The NA of the projection optics has been steadily increased up to about 0.85.

However, as device dimensions continue to shrink, the fundamental limitations of optics will play increasingly larger roles. In particular, diffraction will degrade an aerial image produced by the imaging system when the CD becomes smaller than the exposure, or actinic, wavelength. Consequently, wavefront engineering using resolution enhancement techniques (RETs) may be needed to achieve a sufficiently wide process latitude in the sub-actinic regime.

A phase-shifting mask (PSM) is a type of RET. Unlike a conventional binary mask that only modulates amplitude of light, a PSM also modulates phase of light to use interference to mitigate the detrimental effects of diffraction and enhance resolution of the optics.

In the future, the exposure wavelength will be decreased to even shorter wavelengths, including extreme ultraviolet or EUV light. However, the EUV optics have lower NA than the DUV optics that are currently in use so RETs may have to be employed.

Thus, what is needed is a phase-shifting mask for EUV photolithography and a method of forming such a phase-shifting mask for EUV photolithography.

BRIEF DESCRIPTION OF THE DRAWINGS

FIG. 2C is also an illustration of a cross-sectional view of various embodiments of an extreme ultraviolet (EUV) attenuated PSM according to the present invention.

FIG. 3D is also an illustration of a cross-sectional view of various embodiments of an extreme ultraviolet (EUV) alternating PSM according to the present invention.

DETAILED DESCRIPTION OF THE PRESENT INVENTION

In the following description, numerous details, such as specific materials, dimensions, and processes, are set forth in order to provide a thorough understanding of the present invention. However, one skilled in the art will realize that the invention may be practiced without these particular details. In other instances, well-known semiconductor equipment and processes have not been described in particular detail so as to avoid obscuring the present invention.

The present invention describes a method of forming a phase-shifting mask (PSM) for extreme ultraviolet (EUV) photolithography and an EUV PSM. The peak illumination wavelength for EUV light may be selected from a range of about 10–15 nanometers (nm), such as about 11.3 nm or about 13.4 nm. Various embodiments of a method of fabricating the EUV PSM according to the present invention will be described next.

Figure 1A:
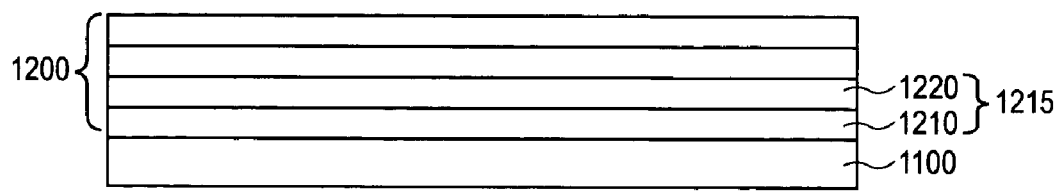
FIGS. 1A–B are illustrations of a cross-sectional view of various embodiments of a method of forming an extreme ultraviolet (EUV) phase-shifting mask (PSM) blank according to the present invention.

As shown in an embodiment of the present invention in FIG. 1A, a substrate 1100 used as a starting material for the EUV PSM of the present invention should be formed from a robust material that has a low coefficient of thermal expansion (CTE), such as about 5 parts per billion (ppb)/degree Kelvin or less. The low CTE will reduce image displacement error when the EUV PSM is heated up by exposure to EUV light.

The substrate 1100 may be formed from a glass or a ceramic material. The substrate 1100 should have a low defect level since any defect on the substrate 1100 may be propagated up through the overlying multilayers which are very thin. The defect density for defect sizes of 35 nm and larger should be about 0.003 defects/square centimeter or less.

Both a frontside surface and a backside surface of the substrate 1100 should be smooth, flat, and have a small local slope. The smoothness should be about 0.15 nm root-mean-squared (RMS) or less. The flatness should be about 30 nm peak-to-valley (P-V) or less. The local slope should be about 1.0 milliradian (mrad) or less.

Virtually all materials, even gases, strongly absorb EUV light, so an optical element, including the EUV PSM, must be reflective, rather than transmissive, and operated in a vacuum, in order to produce a sufficiently high output intensity. However, a single-surface mirror formed from nearly any material would have too low reflectivity for EUV light so the EUV PSM uses a multiplayer (ML) mirror that is based on the principle of a distributed Bragg reflector (DBR) and formed from thin films.

A refractive index of a material, or optical medium, is a ratio of the speed of light in a vacuum relative to the speed of light in that material. The refractive index (n) is a complex number that may be represented by $n=(1-\bullet)+i(\bullet)$. The real part $(1-\bullet)$ describes the dispersion, or shifting of phase, of light while the imaginary part $(\bullet)$ describes the absorption, or attenuation of amplitude, of light.

As shown in an embodiment of the present invention in FIG. 1A, a ML mirror 1200 is formed over the substrate 1100. The ML mirror 1200 is formed from alternating layers of two materials that have dissimilar index of refraction. The period is equivalent to a pair, or bilayer 1215, of a high index of refraction material 1210 and a low index of refraction material 1220.

The high index of refraction material 1210 bends, or scatters, light at the illumination wavelength. In an embodiment of the present invention, the high index of refraction material 1210 may include one or more elements with a high atomic number (Z) in the periodic table of elements. In another embodiment of the present invention, the high index of refraction material 1210 may be a metal, such as molybdenum (Z=42), or an alloy. The layer of high index of refraction material 1210 in the ML mirror 1200 should be as thin as possible.

The low index of refraction material 1220 transmits light at the illumination wavelength. In an embodiment of the present invention, the low index of refraction material 1220 may include one or more elements with a low Z in the periodic table of elements. In another embodiment of the present invention, the low index of refraction material 1220 may be silicon (Z=14). In still another embodiment of the present invention, the low index of refraction material 1220 may be beryllium (Z=4). The low index of refraction material 1220 should have minimal absorption at the illumination wavelength. The layer of low index of refraction material 1220 in the ML mirror 1200 serves as a filter or spacer layer.

The high index of refraction material 1210 in the ML mirror 1200 may be crystalline, polycrystalline, or amorphous. The low index of refraction material 1220 in the ML mirror 1200 may also be crystalline, polycrystalline or amorphous. An interface between the high index of refraction material 1210 and the low index of refraction material 1220 in the ML mirror 1200 should remain chemically and physically stable during fabrication of the EUV PSM. The interface between the high index of refraction material 1210 and the low index of refraction material 1220 in the ML mirror 1200 should also remain chemically and physically stable during exposure of the EUV PSM to EUV light. Any interdiffusion at the interface between the high index of refraction material 1210 and the low index of refraction material 1220 in the ML mirror 1200 should be minimized since the optical properties of the ML mirror 1200 are more optimal when the individual layers are smooth, the transitions between the different materials are abrupt, and the thickness variation for each layer across the EUV PSM is 0.01 nm or less.

The thickness of each layer in the ML mirror 1200 depends on a wavelength (or lambda) of the illumination light. The reflected light will be resonant when the path length is equivalent to half of the wavelength of light. To a first approximation, each layer in the ML mirror 1200 has a thickness of about one quarter of the wavelength since the light makes 2 passes through the reflective mask. The thickness of the individual layer in the ML mirror 1200 also depends upon an angle of incidence of the illumination light. The angle of incidence may be selected from a range of about 3.5–6.5 degrees off normal to a front surface of the EUV PSM.

The thicknesses of the alternating layers in the ML mirror 1200 may be tuned or optimized to maximize constructive interference of the EUV light at each interface and to minimize absorption of the EUV light overall. Constructive interference refers to light waves interacting with each other in-phase. Constructive interference occurs at (m) times the wavelength of light, where the order number m=0, 1, 2, 3 . . . . Destructive interference refers to light waves interacting with each other out-of-phase. Destructive interference occurs at (m+½) times the wavelength of light, where the order number m=0, 1, 2, 3 . . . .

In an embodiment of the present invention, the ML mirror 1200 may achieve a maximum reflectivity of about 60–80% at the peak illumination wavelength. In another embodiment of the present invention, the ML mirror 1200 may achieve a maximum reflectivity of about 70% at the peak illumination wavelength.

Optimizing the ML mirror 1200 for maximum reflectivity may lead to a compressive stress, such as about −350 MegaPascals (MPa), which may distort the ML mirror 1200 by about 0.10 nm. The deformation induced by stress may be decreased by annealing the multilayers or by adding a buffer layer (not shown) between the substrate 1100 and the ML mirror 1200.

In an embodiment of the present invention, the ML mirror 1200 may have about 20–80 pairs of alternating layers of the high index of refraction material 1210 and the low index of refraction material 1220.

In another embodiment of the present invention, the ML mirror 1200 may have about 40 pairs of alternating layers of molybdenum and silicon (Mo/Si bilayer). The high index of refraction material 1210 may include molybdenum (Z=42) with a thickness, such as about 2.8 nm. The low index of refraction material 1220 may include silicon (Z=14) with a thickness, such as about 4.1 nm. The peak wavelength may be at about 13.4 nm and the peak width may be about 0.50 nm.

In still another embodiment of the present invention, the ML mirror 1200 may have about 70 pairs of alternating layers of molybdenum and beryllium (Mo/Be bilayer). The low index of refraction material 1220 may include beryllium (Z=4). The peak wavelength may be at about 11.3 nm and the peak width may be about 0.28 nm. The ML mirror 1200 formed from Mo/Be bilayers may have a higher peak reflectivity at the peak wavelength, but tends to be more sensitive to surface roughness.

The ML mirror 1200 may be formed over the substrate 1100 by using direct current (DC) magnetron sputtering or ion beam deposition (IBD). The thickness uniformity should be 0.8% or better across the substrate 1100. A DC magnetron sputtering process is more conformal, thus producing better thickness uniformity, but any defect on the substrate 1100 may be propagated up through the alternating layers to the top surface of the ML mirror 1200.

In an embodiment of the present invention, a defect in the substrate 1100 may affect amplitude of the EUV light reflected off the ML mirror 1200 if the defect absorbs EUV light. In another embodiment of the present invention, the defect in the substrate 1100 may affect phase of the EUV light reflected off the ML mirror 1200 if the defect changes the path length. In still another embodiment of the present invention, the defect may affect both amplitude and phase of the EUV light reflected off the ML mirror 1200.

An IBD process is less conformal, but may result in smaller perturbation and fewer defects in the upper surface of the ML mirror 1200 because the deposition conditions may be optimized to smooth over any defect on the substrate 1100.

In an embodiment of the present invention, the ML mirror 1200 may be formed over the substrate 1100 by using electron-beam (e-beam) evaporation.

In an embodiment of the present invention, a capping layer (not shown) may be formed over the ML mirror 1200 to prevent the ML mirror 1200 from being affected or changed, such as oxidized, by the environment. The capping layer (not shown) should result in minimal phase-shifting of EUV light and minimal attenuation of the amplitude of EUV light. The capping layer (not shown) may be formed from a suitable material, such as carbon (C), silicon carbide (SiC), silicon (Si), Ruthenium (Ru), and silicon nitride ($Si_3N_4$).

A capping layer (not shown) that is thinner will reduce shadowing during use of the EUV PSM. A capping layer (not shown) that is thinner will also help reduce thermally-induced stress in the EUV PSM during exposure to EUV light. Depending on the material selected, the capping layer (not shown) may be deposited by radio frequency (RF) magnetron sputtering or DC magnetron sputtering. In some cases, the capping layer (not shown) may be deposited by IBD or atomic-layer deposition (ALD).

Figure 1B:
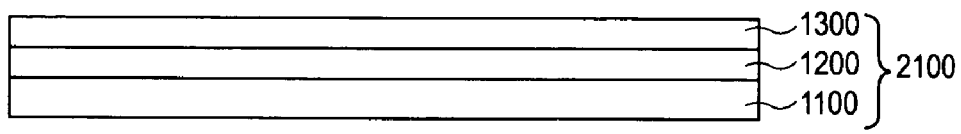

As shown in an embodiment of the present invention in FIG. 1B, a phase-shifter layer 1300 is formed over the ML mirror 1200. The phase-shifter layer 1300 should be robust and easy to pattern.

In an embodiment of the present invention, the phase-shifter layer 1300 should result in strong phase-shifting of EUV light and weak attenuation, or low absorption, of the amplitude of EUV light. In another embodiment of the present invention, the phase-shifter layer 1300 is formed from a material with relatively high delta (●) and low absorption, or beta, (●). In still another embodiment of the present invention, the phase-shifter layer 1300 is formed from a suitable material, such as molybdenum (Z=42) with relatively high delta (●=0.077) and low absorption, or beta, (●=0.0062).

A phase-shifter layer 1300 that is thinner will reduce shadowing during use of the EUV PSM. A phase-shifter layer 1300 that is thinner will also help reduce thermally-induced stress in the EUV PSM during exposure to EUV light. Depending on the material selected, the phase-shifter layer 1300 may be deposited by RF magnetron sputtering or DC magnetron sputtering. In some cases, the phase-shifter layer 1300 may be deposited by IBD or ALD.

As shown in an embodiment of the present invention in FIG. 1B, the substrate 1100, the ML mirror 1200, and the phase-shifter layer 1300 form an EUV PSM blank 2100.

Figure 2A:
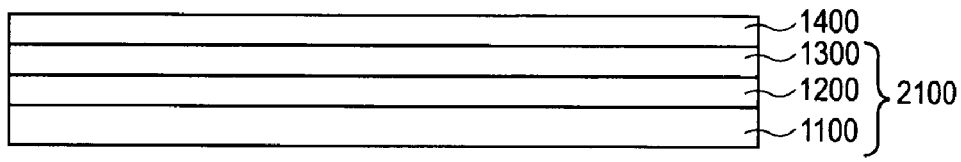
FIGS. 2A–C are illustrations of a cross-sectional view of various embodiments of a method of forming an extreme ultraviolet (EUV) attenuated phase-shifting mask (PSM) according to the present invention.
Figure 2B:
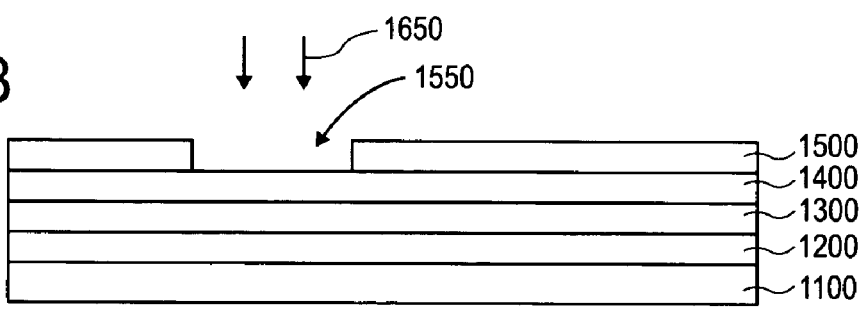
Figure 2C:
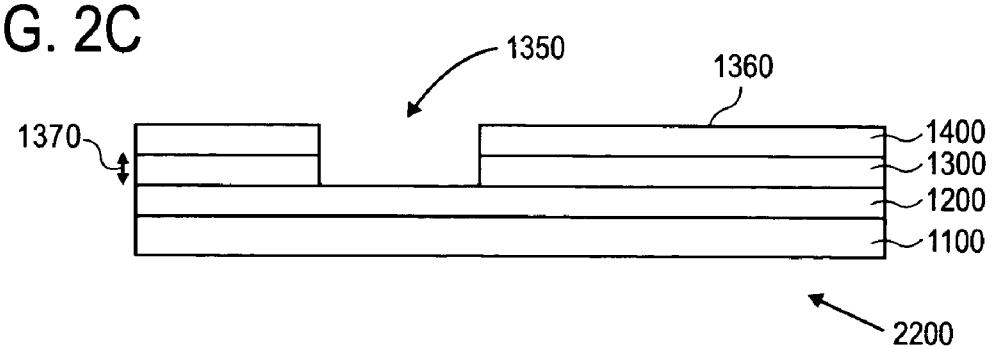

The EUV mask blank 2100, as shown in an embodiment of the present invention in FIG. 1B, may be further processed to form an EUV attenuated PSM 2200, as shown in an embodiment of the present invention in FIG. 2C.

As shown in an embodiment of the present invention in FIG. 2A, a capping layer 1400 may be formed over the phase-shifter layer 1300 to prevent the phase-shifter layer 1300, such as molybdenum, from being affected or changed, such as oxidized, by exposure to the environment. The capping layer 1400 should result in minimal phase-shifting of EUV light and minimal attenuation of the amplitude of EUV light. The capping layer 1400 may be formed from a suitable material, such as carbon (C), silicon carbide (SiC), silicon (Si), Ruthenium (Ru), and silicon nitride ($Si_3N_4$).

A capping layer 1400 that is thinner will reduce shadowing during use of the EUV attenuated PSM 2200. A capping layer 1400 that is thinner will also help reduce thermally-induced stress in the EUV attenuated PSM 2200 during exposure to EUV light. Depending on the material selected, the capping layer (not shown) may be deposited by RF magnetron sputtering or DC magnetron sputtering. In some cases, the capping layer (not shown) may be deposited by IBD or ALD.

In an embodiment of the present invention, the capping layer 1400 may not be needed if the phase-shifter layer 1300 is not affected or changed, such as oxidized, by the environment.

As shown in an embodiment of the present invention in FIG. 2B, the EUV PSM blank 2100 may be covered with a radiation-sensitive layer, such as photoresist 1500, that has been coated, selectively exposed with radiation 1650, and developed to form a pattern 1550. The photoresist 1500 has a thickness selected from a range of about 50–150 nm. A chemically-amplified resist (CAR) may be used. Depending on the type of photoresist 1500 used, exposure may be performed with an electron-beam (e-beam) writer or a laser writer.

A post-develop measurement of critical dimension (CD) may be performed on the features in the developed pattern 1550 in the photoresist 1500. The CD measurement may be performed with a top-down scanning electron microscope (SEM) or an optical metrology tool.

The developed pattern 1550 in the photoresist 1500 may be transferred into the underlying capping layer 1400 and the phase-shifter layer 1300, as shown in an embodiment of the present invention in FIG. 2C. Line-edge roughness (LER) of the etched pattern 1350 in the capping layer 1400 and the phase-shifter layer 1300 should be minimized.

A reactive ion etch (RIE) process may be used to etch the portions of the capping layer 1400 and the phase-shifting layer 1300 that are not covered by the photoresist 1500. The RIE of the capping layer 1400 and the phase-shifting layer 1300 may be performed with a halogen-containing gas, such as chlorine ($Cl_2$), boron trichloride ($BCl_3$), or nitrogen trifluoride ($NF_3$). Argon may be used as a carrier gas. In some cases, oxygen may also be included.

The etch rate and the etch selectivity may depend on power, pressure, and substrate temperature. In an embodiment of the present invention, a hard mask process may be used. In such a process, the developed pattern 1550 in the photoresist 1500 is first transferred into a hard mask layer (not shown) that had been previously formed below the photoresist 1500. The hard mask layer (not shown) is formed from a material that has a lower etch rate than the photoresist 1500. The etched pattern in the hard mask layer (not shown) may be subsequently transferred into the capping layer 1400 and the phase-shifting layer 1300.

In another embodiment of the present invention, the developed pattern 1550 in the photoresist 1500 may be transferred into the capping layer 1400 and the phase-shifting layer 1300 with a sputtering process or an ion milling process.

In an embodiment of the present invention, a buffer layer (not shown) may be formed between the phase-shifting layer 1300 And the ML mirror 1200 to serve as an etch stop for the etch. The buffer layer (not shown) may also protect the ML mirror 1200 from being affected or changed, such as being oxidized, by the environment.

The buffer layer (not shown) may be formed from a silicon oxide ($SiO2$), such as a low temperature oxide (LTO). A low temperature process, such as about 150 degrees centigrade or less, may prevent interdiffusion of the alternating layers in the underlying ML mirror 1200. Other materials, such as silicon oxynitride (SiON) or carbon (C), may be used for the buffer layer (not shown). The buffer layer (not shown) may have a thickness selected from a range of about 20–105 nm. The buffer layer (not shown) may be deposited by RF sputtering.

Removal of the photoresist 1500 after etch may be followed by a post-etch measurement of the CD of the features in the etched pattern 1350 in the capping layer 1400 and the phase-shifting layer 1300. The CD measurement may be performed with the top-down SEM or the optical metrology tool.

Then, defect inspection may be done at a wavelength selected from a range of about 150–500 nm. The defect inspection is based on a comparison of the light signals in the etched pattern 1350 relative to the light signals in a non-patterned region 1360. In an embodiment of the present invention, defect inspection may be performed with EUV light.

As shown in an embodiment of the present invention in FIG. 2C, the substrate 1100, the ML mirror 1200, the phase-shifter layer 1300, and the capping layer 1400 form the EUV attenuated PSM 2200. The EUV attenuated PSM 2200 is a type of weak (not enough intensity to cause strong interference) or edge-enhancing PSM. The EUV attenuated PSM 2200 is topologically symmetric so it is applicable to a random layout and is not susceptible to phase conflicts in adjacent features. Thus, the EUV attenuated PSM 2200 is not only effective for enhancing the resolution of periodic or nested features, such as grouped lines and spaces, but is also effective for enhancing the resolution of isolated features, such as isolated contacts and isolated vias.

In an embodiment of the present invention, the phase-shifter layer 1300 may have a thickness 1370 of about 43 nm to generate a 180-degree (pi) phase shift with 60% transmission. In another embodiment of the present invention, the phase-shifter layer 1300 may have a thickness 1370 of about 129 nm to generate a 540-degree (3 pi) phase shift with 20% transmission. In still another embodiment of the present invention, the phase-shifter layer 1300 may have a thickness 1370 of about 215 nm to generate a 900-degree (5 pi) phase shift with 8% transmission.

The transmission through the attenuated regions should be below the photoresist threshold in order to improve resolution of the features. In an embodiment of the present invention, the transmission through the attenuated regions is 20% or less. In another embodiment of the present invention, the transmission through the attenuated regions is 8% or less.

Figure 3A:
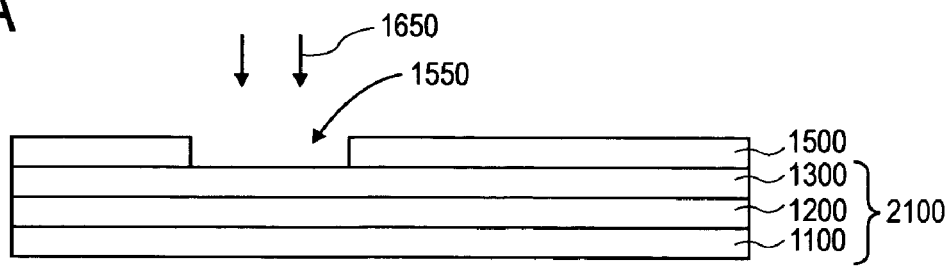
FIGS. 3A–D are illustrations of a cross-sectional view of various embodiments of a method of forming an extreme ultraviolet (EUV) alternating phase-shifting mask (PSM) according to the present invention.
Figure 3B:
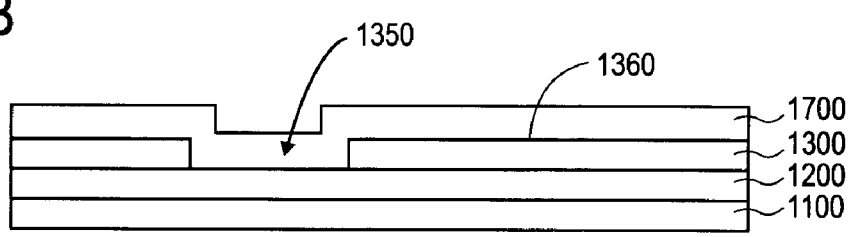
Figure 3C:
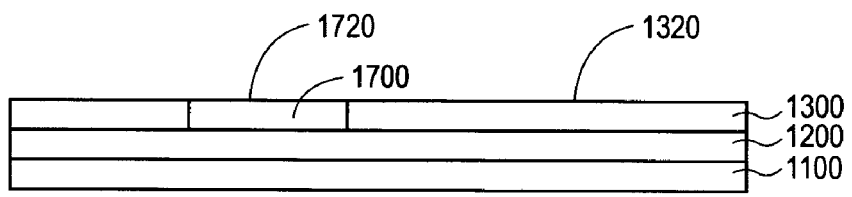
Figure 3D:
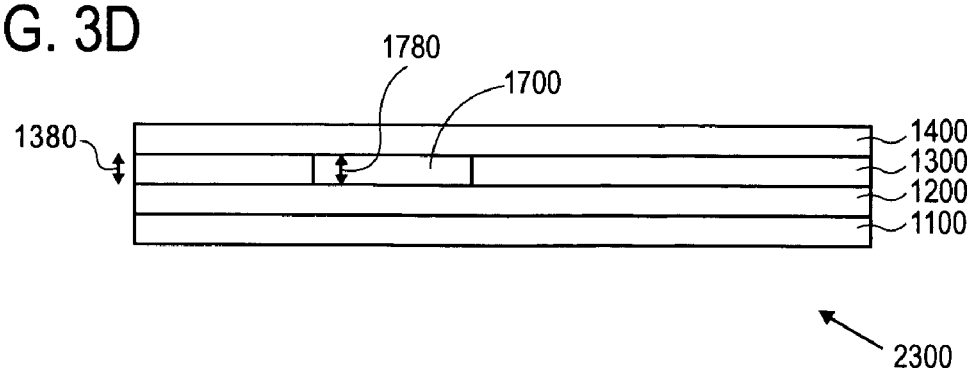

The EUV PSM blank 2100, as shown in an embodiment of the present invention in FIG. 1B, may also be further processed to form an EUV alternating PSM 2300, as shown in an embodiment of the present invention in FIG. 3D.

As shown in an embodiment of the present invention in FIG. 3A, the EUV PSM blank 2100 may be covered with a radiation-sensitive layer, such as photoresist 1500, that has been coated, selectively exposed with radiation 1650, and developed to form a pattern 1550. The photoresist 1500 has a thickness selected from a range of about 50–150 nm. A CAR may be used. Depending on the type of photoresist 1500 used, exposure may be performed with an e-beam writer or a laser writer.

A post-develop measurement of CD may be performed on the features in the developed pattern 1550 in the photoresist 1500. The CD measurement may be performed with the top-down SEM or the optical metrology tool.

The developed pattern 1550 in the photoresist 1500 may be transferred into the underlying phase-shifting layer 1300, as shown in an embodiment of the present invention in FIG. 3B. LER of the etched pattern 1350 in the phase-shifting layer 1300 should be minimized.

A RIE process may be used to etch the portions of the phase-shifting layer 1300 that are not covered by the photoresist 1500. The RIE of the phase-shifting layer 1300 may be performed with a halogen-containing gas, such as chlorine ($Cl_2$), boron trichloride ($BCl_3$), or nitrogen trifluoride ($NF_3$). Argon may be used as a carrier gas. In some cases, oxygen may also be included.

The etch rate and the etch selectivity may depend on power, pressure, and substrate temperature. In an embodiment of the present invention, a hard mask process may be used. In such a process, the developed pattern 1550 in the photoresist 1500 is first transferred into a hard mask layer (not shown) that had been previously formed below the photoresist 1500. The hard mask layer (not shown) is formed from a material that has a lower etch rate than the photoresist 1500. The etched pattern in the hard mask layer (not shown) may be subsequently transferred into the phase-shifting layer 1300.

In another embodiment of the present invention, the developed pattern 1550 in the photoresist 1500 may be transferred into the phase-shifting layer 1300 with a sputtering process or an ion milling process.

In an embodiment of the present invention, a buffer layer (not shown) may be formed between the phase-shifting layer 1300 And the ML mirror 1200 to serve as an etch stop for the etch. The buffer layer (not shown) may also protect the ML mirror 1200 from being affected or changed, such as being oxidized, by the environment.

The buffer layer (not shown) may be formed from a silicon oxide ($SiO2$), such as a low temperature oxide (LTO). A low temperature process, such as about 150 degrees centigrade or less, may prevent interdiffusion of the alternating layers in the underlying ML mirror 1200. Other materials, such as silicon oxynitride (SiON) or carbon (C), may be used for the buffer layer (not shown). The buffer layer (not shown) may have a thickness selected from a range of about 20–105 nm. The buffer layer (not shown) may be deposited by RF magnetron sputtering.

Removal of the photoresist 1500 after etch may be followed by a post-etch measurement of the CD of the features in the etched pattern 1350 in the phase-shifting layer 1300. The CD measurement may be performed with the top-down SEM or the optical metrology tool.

Then, defect inspection may be done at a wavelength selected from a range of about 150–500 nm. The defect inspection is based on a comparison of the light signals in the etched pattern 1350 relative to the light signals in a non-patterned region 1360. In an embodiment of the present invention, defect inspection may be performed with EUV light.

An intensity balancer layer 1700 is formed over the phase-shifting layer 1300 and in the etched pattern 1350. The intensity balancer layer 1700 should have relatively low delta and similar absorption, or beta, to the phase-shifter layer 1300. In an embodiment of the present invention, the intensity balancer layer 1700 may be silicon nitride ($Si_3N_4$), which has relatively low delta (●=0.017) and low absorption, or beta, (●=0.00618) similar to the low absorption of the phase-shifter layer 1300.

The thickness 1380 of the phase-shifter layer 1300 and the thickness 1780 of the intensity balancer layer 1700 need not be the same as long as the intensity is balanced. In other words, the thickness 1380 and the thickness 1780 may be selected such that the transmission through the phase-shifter layer 1300 and the transmission through the intensity balancer layer 1700 will be the same.

In an embodiment of the present invention, the thickness 1380 of the phase-shifter layer 1300 and the thickness 1780 of the intensity balancer layer 1700 are selected to be the same. The intensity balancer layer 1700 is planarized until an upper surface 1720 is level with an upper surface 1320 of the phase-shifting layer 1300, as shown in an embodiment of the present invention in FIG. 3C. In an embodiment of the present invention, a chemical-mechanical polishing (CMP) process may be used.

A capping layer 1400 may be formed over the upper surface 1720 of the intensity balancer layer 1700 and the upper surface 1320 of the phase-shifting layer 1300 to prevent the phase-shifting layer 1300, such as molybdenum, from being affected or changed, such as oxidized, by exposure to the environment. The capping layer 1400 should result in minimal phase-shifting of EUV light and minimal attenuation of the amplitude of EUV light. The capping layer 1400 may be formed from a suitable material, such as carbon (C), silicon carbide (SiC), silicon (Si), Ruthenium (Ru), and silicon nitride ($Si_3N_4$).

A capping layer 1400 that is thinner will reduce shadowing during use of the EUV alternating PSM 2300. A capping layer 1400 that is thinner will also help reduce thermally-induced stress in the EUV alternating PSM 2300 during exposure to EUV light. Depending on the material selected, the capping layer (not shown) may be deposited by RF magnetron sputtering or DC magnetron sputtering. In some cases, the capping layer (not shown) may be deposited by IBD or ALD.

In an embodiment of the present invention, the capping layer 1400 may not be needed if the phase-shifting layer 1300 is not affected or changed, such as oxidized, by the environment.

As shown in an embodiment of the present invention in FIG. 3D, the substrate 1100, the ML mirror 1200, the phase-shifter layer 1300, the intensity balancer layer 1700, and the capping layer 1400 form the EUV alternating PSM 2300. The EUV alternating PSM 2300 is a type of strong PSM, with strong enough intensity to cause strong interference, so it can theoretically double the resolution of an optical imaging system and print features that are much smaller than the exposure or illumination wavelength. The interference from the PSM becomes stronger as the partial coherence of the optical imaging system becomes higher.

The EUV alternating PSM 2300 is particularly useful for enhancing the resolution of periodic, or nested, features, such as grouped lines and spaces, especially when the features are very small. However, the EUV alternating PSM 2300 is not very helpful for enhancing the resolution of features near the boundaries since the EUV alternating PSM 2300 is susceptible to phase conflicts in adjacent features. Thus, in an embodiment of the present invention, the EUV alternating PSM 2300 may be designed as a dark-field mask that requires the use of another trim mask, designed as a bright-field mask, to remove features that have been unavoidably printed, as well as, to print less critical features.

A double-exposure process increases complexity of the design, the layout, and the fabrication. However, the double-exposure process allows the EUV alternating PSM 2300 to form very small isolated features, such as isolated lines for the transistor gates.

In an embodiment of the present invention, the phase-shifter layer 1300 may have a thickness 1380 of about 55 nm to generate a 232.2-degree (1.29 pi) phase shift with about 53% transmission. In another embodiment of the present invention, the intensity balancer layer 1700 may have a thickness 1780 of about 55 nm to generate a 52.2-degree (0.29 pi) phase shift with about 53% transmission. Thus, the relative phase between the phase-shifter layer 1300 and the intensity balancer layer 1700 is 180 degrees (pi) and the intensity is balanced.

Many embodiments and numerous details have been set forth above in order to provide a thorough understanding of the present invention. One skilled in the art will appreciate that many of the features in one embodiment are equally applicable to other embodiments. One skilled in the art will also appreciate the ability to make various equivalent substitutions for those specific materials, processes, dimensions, concentrations, and so forth, that are described herein. It is to be understood that the detailed description of the present invention should be taken as illustrative and not limiting, wherein the scope of the present invention should be determined by the claims that follow.

Thus, we have described a phase-shifting mask for EUV photolithography and a method of forming such a phase-shifting mask for EUV photolithography.

I claim:

1. A structure comprising:
   a substrate, said substrate comprising a first region and a second region;
   a multilayer mirror disposed over said first region and said second region;
   a phase-shifter layer disposed over said multilayer mirror in first region
   an intensity balancer layer disposed over said multilayer mirror in said second region; and
   a capping layer disposed over said phase-shifter layer in said first region and over said intensity balancer layer in said second region.

2. The structure of claim 1 wherein said phase-shifter layer comprises molybdenum.

3. The structure of claim 2 wherein said intensity balancer layer comprises silicon nitride.

4. The structure of claim 3 wherein said phase-shifter layer comprises about the same thickness as said intensity balancer layer.

5. The structure of claim 4 wherein said phase-shifter layer comprises a thickness of about 55 nm.

6. The structure of claim 5 wherein transmission in said first region is about the same as transmission in said second region.

7. The structure of claim 6 wherein phase in said first region is shifted about 180 degrees from phase in said second region.

* * * * *